US006861309B2

(12) United States Patent
Taylor et al.

(10) Patent No.: US 6,861,309 B2
(45) Date of Patent: *Mar. 1, 2005

(54) METHODS OF FORMING SPACED CONDUCTIVE REGIONS, AND METHODS OF FORMING CAPACITOR CONSTRUCTIONS

(75) Inventors: Theodore M. Taylor, Boise, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/781,468

(22) Filed: Feb. 17, 2004

(65) Prior Publication Data

US 2004/0159897 A1 Aug. 19, 2004

Related U.S. Application Data

(63) Continuation of application No. 10/177,054, filed on Jun. 21, 2002, now Pat. No. 6,703,272.

(51) Int. Cl.[7] .......................................... H01L 21/8242
(52) U.S. Cl. ..................... 438/239; 438/253; 438/396
(58) Field of Search .................... 438/239, 253–255, 438/396–398

(56) References Cited

U.S. PATENT DOCUMENTS 5,763,306 A * 6/1998 Tsai ............................ 438/255

| 6,037,212 | A | 3/2000 | Chao | |
| 6,171,902 | B1 | 1/2001 | Ida | |
| 6,458,654 | B1 | 10/2002 | Claimpitt | |
| 6,555,429 | B2 * | 4/2003 | Matsui et al. | 438/241 |
| 6,703,272 | B2 * | 3/2004 | Taylor et al. | 438/239 |

* cited by examiner

*Primary Examiner*—Phat X. Cao
*Assistant Examiner*—Theresa T. Doan
(74) *Attorney, Agent, or Firm*—Wells St. John P.S.

(57) ABSTRACT

The invention includes a method of forming spaced conductive regions. A construction is formed which includes a first electrically conductive material over a semiconductor substrate. The construction also includes openings extending through the first electrically conductive material and into the semiconductor substrate. A second electrically conductive material is formed within the openings and over the first electrically conductive material and is in electrical contact with the first electrically conductive material. The second electrically conductive material is subjected to anodic dissolution while the first electrically conductive material is electrically connected to a power source. The second electrically conductive material within the openings becomes electrically isolated from the first electrically conductive material as the dissolution progresses, and some of the second electrically conductive material remains within the openings in the substrate as spaced conductive regions after the anodic dissolution.

19 Claims, 8 Drawing Sheets

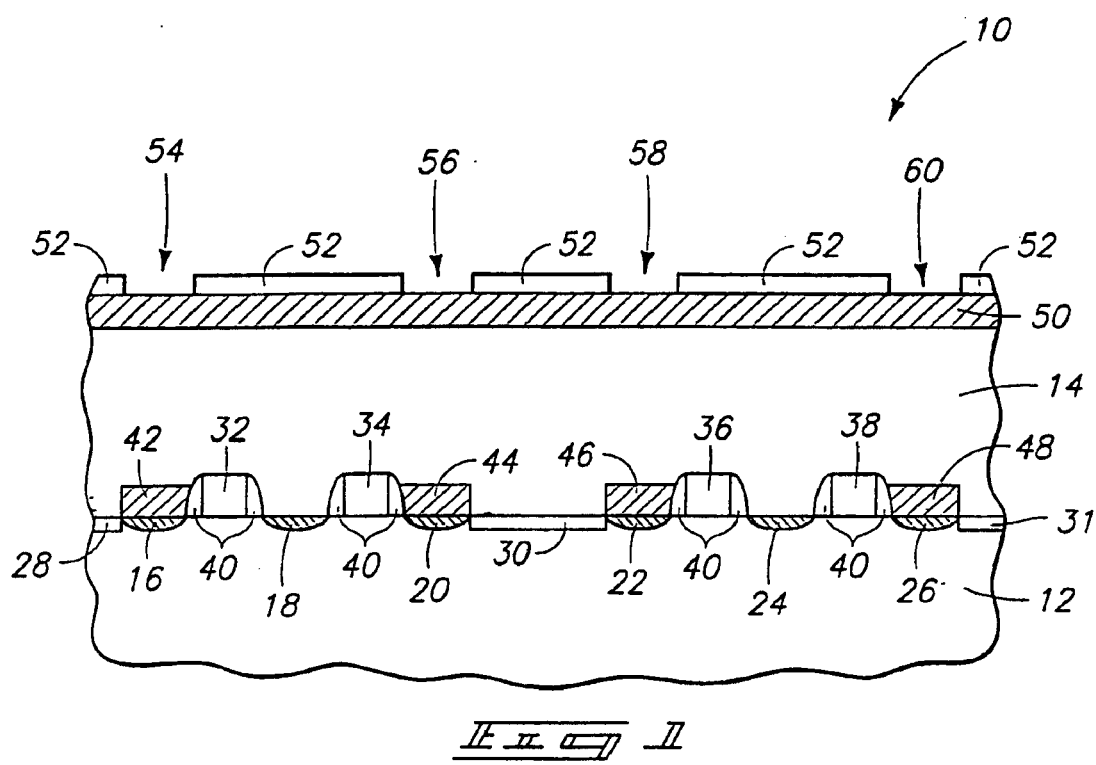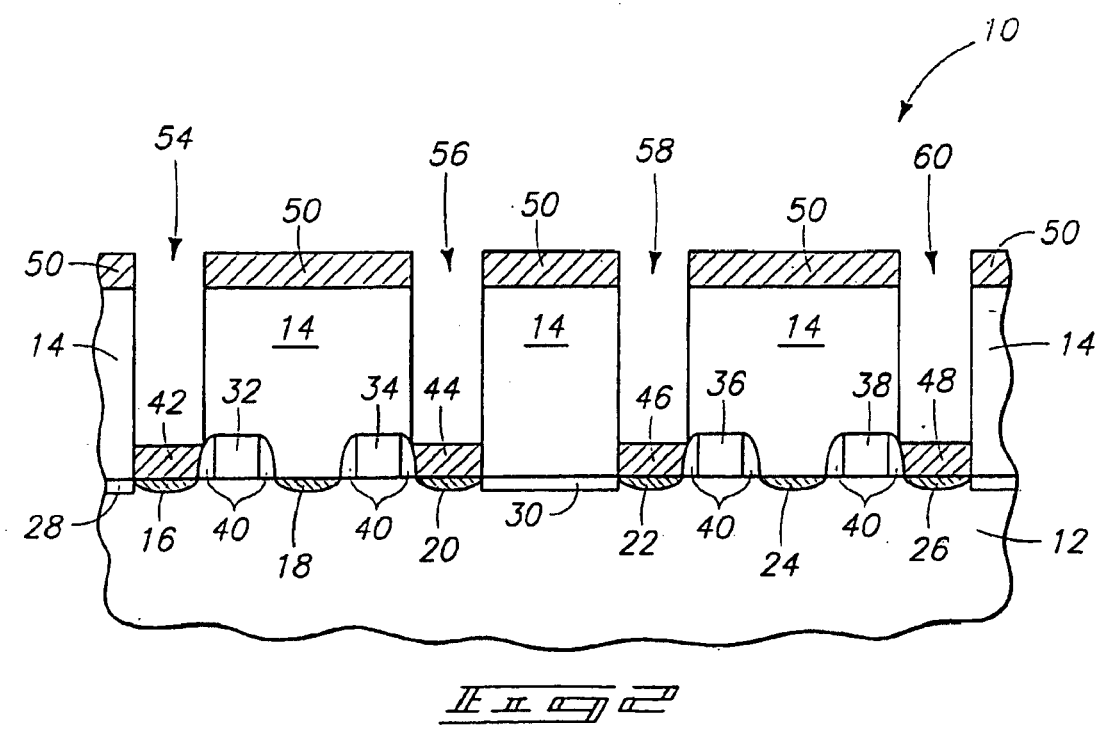

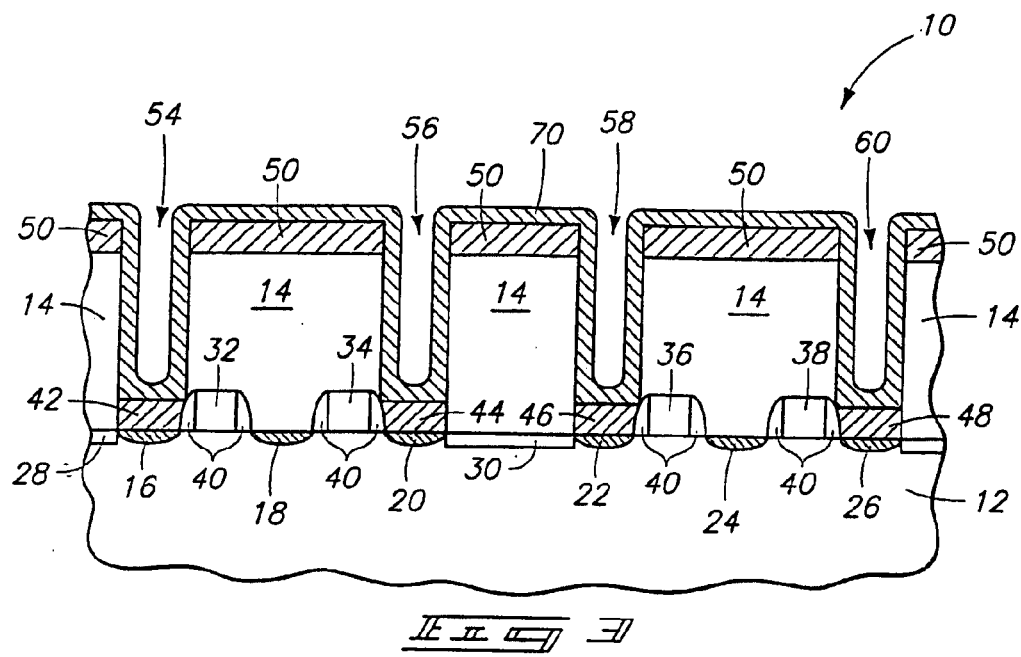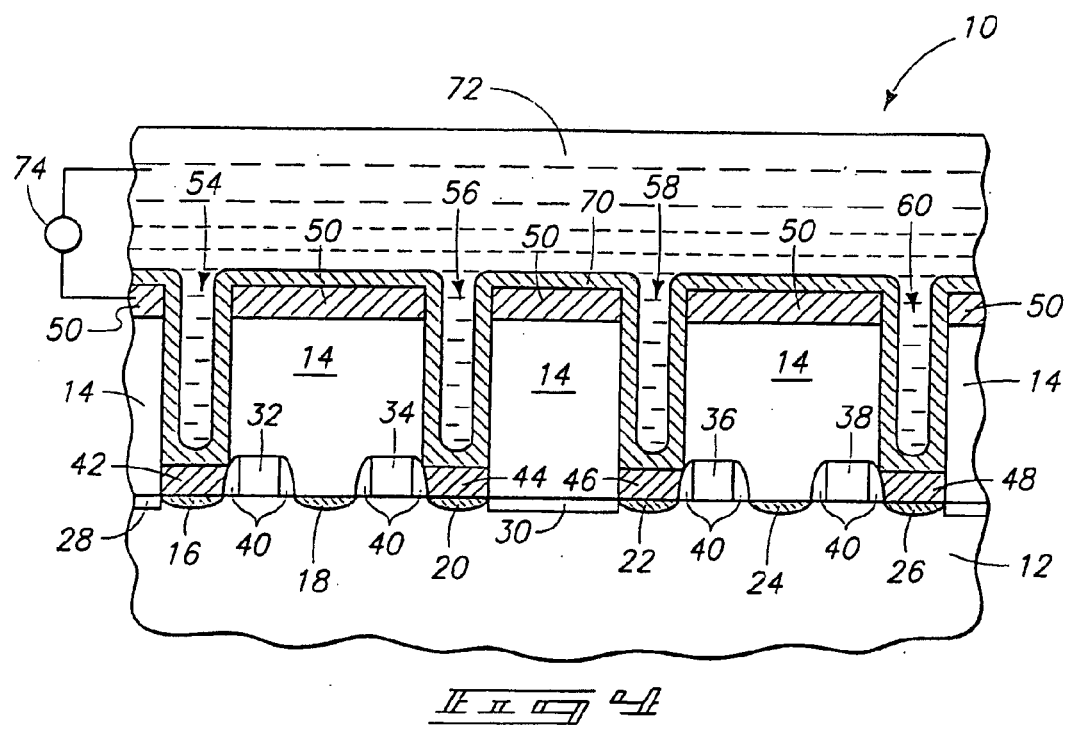

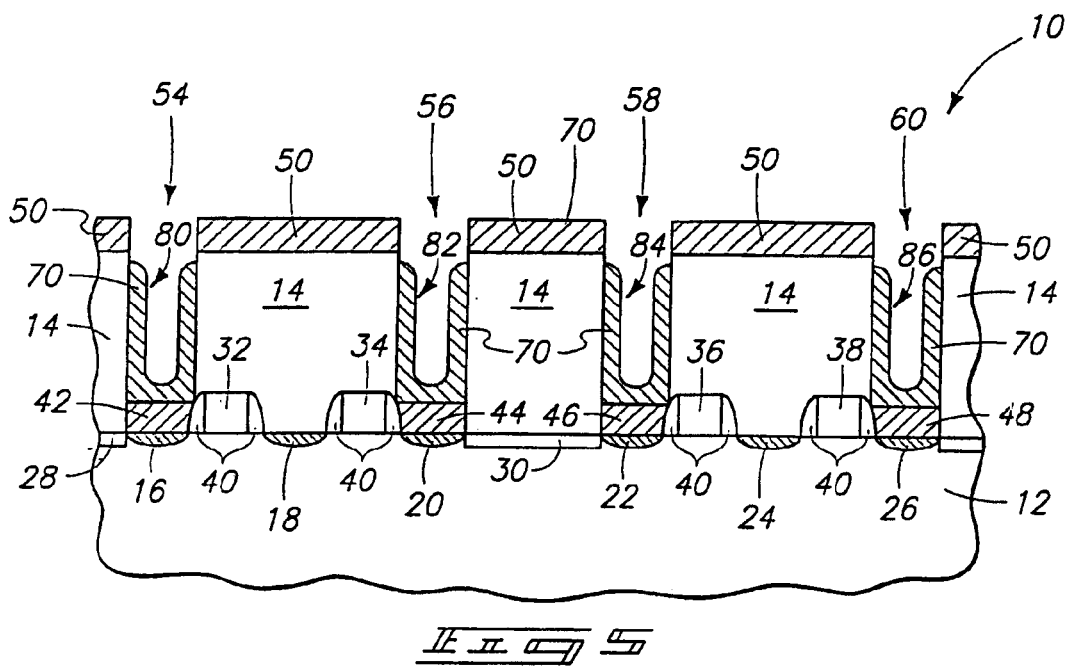
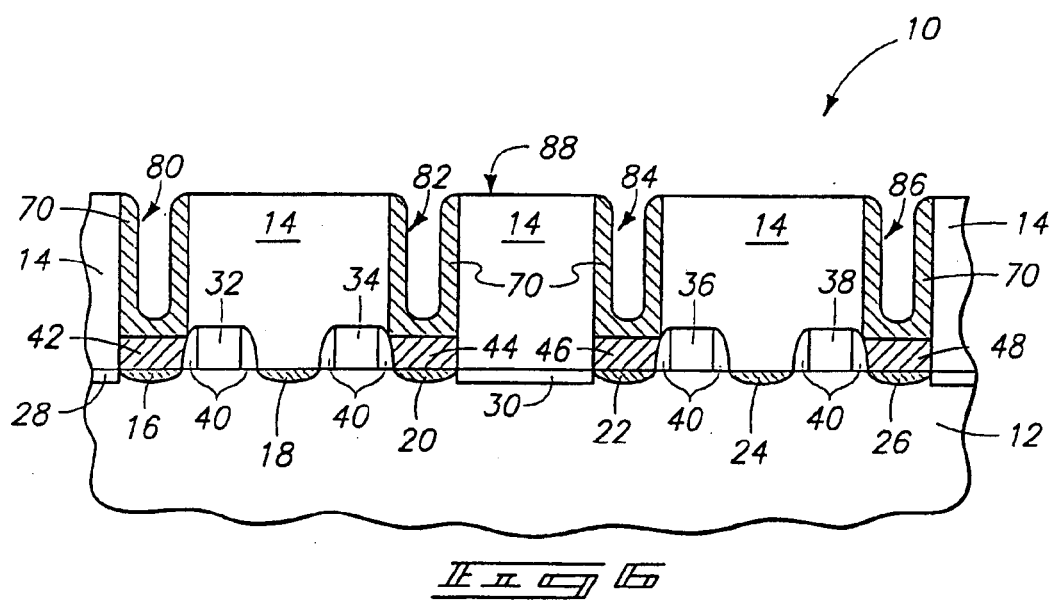

US 6,861,309 B2

METHODS OF FORMING SPACED CONDUCTIVE REGIONS, AND METHODS OF FORMING CAPACITOR CONSTRUCTIONS

RELATED PATENT DATA

This patent resulted from a continuation application of U.S. patent application Ser. No. 10/177,054, which was filed Jun. 21, 2002 now U.S. Pat. No. 6,703,272.

TECHNICAL FIELD

The invention pertains to methods of forming spaced conductive regions, and in particular aspects pertains to methods of forming capacitor constructions.

BACKGROUND OF THE INVENTION

Capacitor constructions are utilized in numerous semiconductor devices including, for example, dynamic random access memory (DRAM) devices. Capacitor constructions comprise a pair of conductive nodes separated from one another by dielectric material, and accordingly capacitively coupled with one another. The conductive components of capacitor constructions can comprise numerous materials, including, for example, metals, metal alloys, and conductively-doped semiconductive materials (such as, for example, conductively-doped silicon). There can be advantages to utilizing metals in capacitor constructions, and recently there have been efforts to incorporate various so-called noble metals into capacitor constructions. Exemplary noble metals are platinum, rhodium, iridium and ruthenium.

Various problems are encountered during attempts to incorporate noble metals into capacitor constructions. For instance, it is typically desired that an array of capacitor constructions be simultaneously formed. Ultimately, it is desired to form numerous conductive storage nodes associated with the array. The individual storage nodes are spaced from one another, and can accordingly be considered spaced conductive regions. However, it can be difficult to pattern various metals into spaced conductive regions. For instance, it is found that platinum will smear during various traditional semiconductor fabrication steps (such as, for example, chemical-mechanical polishing). The smearing can inhibit formation of a bottom electrode in a container.

In light of the above-described difficulties, it is desirable to develop new methods of forming spaced conductive regions associated with semiconductor constructions; and it is further desirable that such new methods be suitable for utilization in capacitor fabrication.

It is noted that although the invention was motivated by the problems discussed above, the invention is not to be limited to the applications discussed above except to the extent that the applications are expressly recited in the claims that follow.

SUMMARY OF THE INVENTION

In one aspect, the invention includes a method of forming spaced conductive regions associated with a semiconductor construction. For instance, an exemplary application of the invention is formation of a bottom electrode of a container capacitor. A construction is formed which includes a first electrically conductive material over a semiconductor substrate. Openings extend through the first electrically conductive material and into the semiconductor substrate. A second electrically conductive material is formed within the openings and over the first electrically conductive material. The second electrically conductive material comprises a different composition than the first electrically conductive material, and is in electrical contact with the first electrically conductive material. The second electrically conductive material is subjected to anodic dissolution. During the dissolution, the first electrically conductive material is electrically connected to a power source. The second electrically conductive material within the openings becomes electrically isolated from the first electrically conductive material as the dissolution progresses, and some of the second electrically conductive material remains within the openings in the substrate as spaced conductive regions after the anodic dissolution. The second electrically conductive material can be subsequently incorporated into a container-shaped capacitor as a bottom electrode.

In further aspects, the invention pertains to methods of forming capacitor constructions.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing stage of a method of the present invention.

FIG. 2 is a view of the FIG. 1 fragment shown at a processing stage subsequent to that of FIG. 1.

FIG. 3 is a view of the FIG. 1 fragment shown at a processing stage subsequent to that of FIG. 2.

FIG. 4 is a view of the FIG. 1 fragment shown at a processing stage subsequent to that of FIG. 3.

FIG. 5 is a view of the FIG. 1 fragment shown at a processing stage subsequent to that of FIG. 4.

FIG. 6 is a view of the FIG. 1 fragment shown at a processing stage subsequent to that of FIG. 5.

DESCRIPTION OF THE PREFERRED EMBODIMENTS

Figure 7:
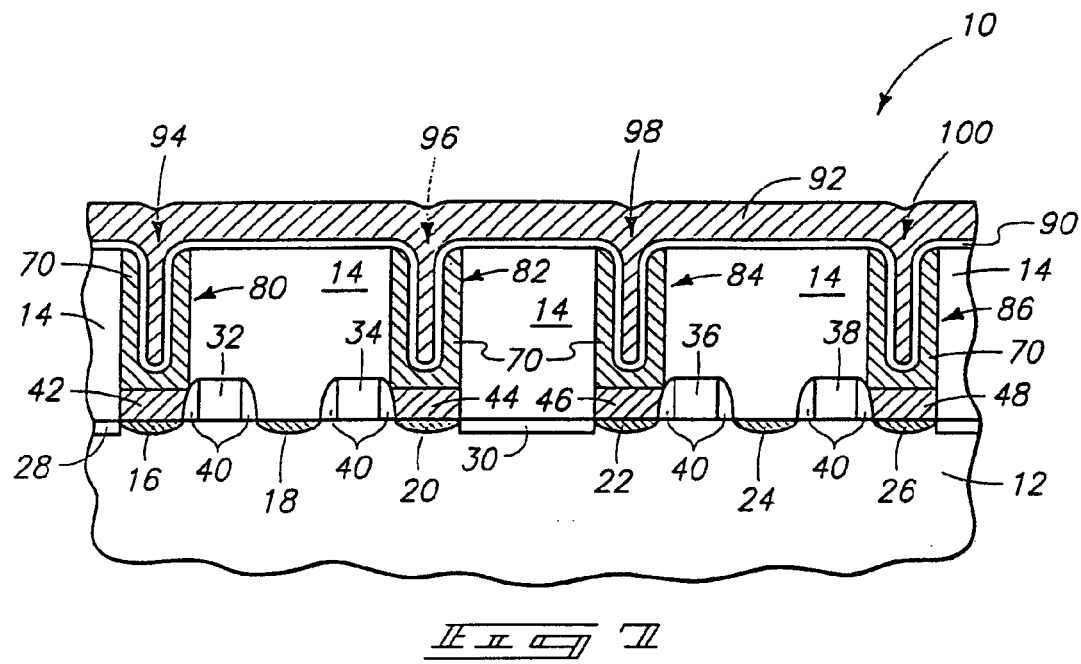
FIG. 7 is a view of the FIG. 1 fragment shown at a processing stage subsequent to that of FIG. 6.

An exemplary aspect of the invention is described with reference to FIGS. 1–7. Referring initially to FIG. 1, a construction 10 is illustrated at a preliminary process stage. Construction 10 comprises a base 12 having an electrically insulative material 14 thereover. Base 12 can comprise a bulk semiconductive material, such as, for example, monocrystalline silicon. The silicon can be lightly-doped with background p-type and/or n-type dopant. In particular aspects, base 12 will correspond to a fragment of a monocrystalline silicon wafer.

Insulative mass 14 can comprise, for example, borophosphosilicate glass (BPSG), silicon dioxide and/or silicon nitride.

A plurality of structures are illustrated associated with base 12. The structures include diffusion regions 16, 18, 20, 22, 24 and 26 extending into base 12. The diffusion regions can comprise, for example, either n-type or p-type doped regions of the semiconductive material of base 12.

Isolation regions 28, 30 and 31 are shown extending into base 12 and electrically separating some of the diffusion regions from one another. Isolation regions 28, 30 and 31 can correspond to, for example, shallow trench isolation regions, or other suitable isolation regions.

Transistor gates 32, 34, 36 and 38 are formed over base 12, and between various of the diffusion regions. Sidewall spacers 40 are formed along the sidewalls of the transistor gates. The transistor gates can comprise conventional constructions, and in particular aspects can comprise a gate oxide having various conductive materials formed thereover. Sidewall spacers 40 can also comprise conventional constructions, and in particular aspects can comprise silicon nitride and/or silicon dioxide.

Conductive pedestals 42, 44, 46 and 48 are shown formed in electrical connection with source/drain regions 16, 20, 22, and 26, respectively. The conductive pedestals can be referred to as electrical nodes in the discussion that follows. The electrical nodes are ultimately utilized for electrical connection of capacitor constructions (described below) with the underlying source/drain regions in forming DRAM constructions. It is to be understood that the conductive pedestals are optional, and can be eliminated in various aspects of the invention.

A DRAM cell is typically understood to comprise a capacitor gatedly connected to a bitline through a transistor gate. Accordingly, gate 32 can be incorporated into a DRAM cell by electrically connecting electrical node 42 to a capacitor (described below) and electrically connecting diffusion region 18 to a bitline (not shown). Similarly, each of transistors 34, 36 and 38 can be incorporated into DRAM cells. It is noted that a bitline connected with source/drain region 18 would be shared between a DRAM cell comprising transistor gate 32 and another DRAM cell comprising gate 34.

An electrically conductive material 50 is formed over insulative mass 14. Conductive material 50 can comprise, for example, tungsten.

A patterned mask 52 is formed over material 50. Mask 52 can comprise, for example, photoresist; and can be patterned utilizing photolithographic processing.

Openings 54, 56, 58 and 60 extend between spaced portions of mask 52.

In describing the various applications of the invention which follow, it is useful to utilize the term "substrate" to refer to various supporting structures, and combinations of supporting structures, of construction 10. Accordingly, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In various aspects of the discussion that follows, base 12 can be referred to as a substrate; in other aspects the combination of base 12 and mass 14 can be referred to as a substrate; and in yet other aspects the combination of base 12, mass 14 and conductive material 50 can be referred to as a substrate.

Referring to FIG. 2, openings 54, 56, 58 and 60 are extended through conductive material 50 and into mass 14. In the shown aspect of the invention, the openings are extended to expose uppermost surfaces of conductive pedestals 42, 44, 46 and 48. After the openings are extended into material 50, patterned mask 52 (FIG. 1) is removed.

As discussed above, the term "substrate" can be utilized to refer to a combination of base 12 and mass 14. In such description, material 50 can be considered to be formed over the substrate comprising base 12 and mass 14. Further, the openings 54, 56, 58 and 60 of FIG. 2 can be considered to be extended into the substrate comprising base 12 and mass 14. In other aspects, base 12 can itself be considered a substrate, and mass 14 can be considered a material formed over the substrate. In such aspects, the openings would be considered formed into mass 14, but not within the substrate supporting mass 14.

Referring to FIG. 3, a conductive material 70 is formed within openings 54, 56, 58 and 60, as well as over conductive material 50. In the shown aspect of the invention, conductive material 70 is formed to be in physical and electrical contact with the nodes 42, 44, 46 and 48.

Conductive material 70 comprises a different composition than conductive material 50. Conductive materials 50 and 70 can be referred to as first and second conductive materials, respectively.

In particular aspects of the invention conductive material 70 can comprise a so-called noble element, such as, for example, platinum, rhodium, iridium and ruthenium. Conductive material 70 can comprise the noble metals in elemental form, or can comprise alloys containing one or more of the noble metals. In an exemplary aspect of the invention, first conductive material 50 comprises tungsten and second conductive material 70 comprises platinum. In further aspects, first conductive material 50 can consist or consist essentially of tungsten; and second material 70 can consist or consist essentially of platinum.

In the application of FIG. 3, second conductive material 70 is formed to only partially fill openings 54, 56, 58 and 60; and accordingly the second conductive material narrows the openings.

Referring to FIG. 4, construction 10 is provided within a vessel (not shown) and an electrolytic solution 72 is provided over conductive material 70. A power source 74 is provided in electrical connection with conductive material 50 and electrolytic solution 72, and subsequently power is provided from source 74 to cause anodic dissolution of material 70. It can be preferred that inhibitors not be utilized during the anodic dissolution, with exemplary inhibitors being large organic materials such as metal acetates.

It is noted that although material 50 appears to be in the form of discrete and separate islands in the cross-sectional view of FIG. 4, the material is preferably physically continuous over an upper surface of mass 14. Accordingly, the apparent islands in the cross-sectional view of FIG. 4 would actually be interconnected with one another through expanses of material extending into and out of the page relative to the FIG. 4 view. Material 50 thus forms a continuous conductive layer extending across an upper surface of mass 14. Such upper layer is utilized to provide an electrical connection to material 70 during the anodic dissolution of material 70. In particular aspects, layer 50 is utilized to maintain an electrical bias along all areas (except areas within openings) on a front surface of a semiconductor construction during the anodic dissolution of material 70.

At the initial stage of anodic dissolution of FIG. 4, material 70 is exposed to electrolytic solution 72 and material 50 is not. Accordingly, material 70 dissolves through the anodic dissolution process and material 50 is protected from anodic dissolution by the overlying mass of material 70. However, as the dissolution progresses, material 70 is removed from over upper surfaces of material 50 and accordingly material 50 can also be subjected to anodic dissolution. Preferably, material 50 is provided to a sufficient thickness so that a continuous layer of material 50 remains over mass 14 during the anodic dissolution of material 70, and accordingly, material 50 remains a continuous conductive layer over mass 14 during the anodic dissolution process. It is noted that if too much of material 50 is removed during the anodic dissolution, then islands of conductive material can form over mass 14, with such islands not being electrically connected to power source 74. Anodic dissolution will effectively cease at the various islands. It is desired that such electrically isolated islands not form from material 50 during an anodic dissolution process. Formation of electrically isolated islands of material 50 can be alleviated and/or prevented by forming material 50 to be sufficiently thick so that anodic dissolution of material 50 does not progress entirely through the thickness of the layer of material 50 during removal of material 70. Additionally, and/or alternatively, the compositions of material 50 and 70 can be chosen so that material 70 is more rapidly removed by anodic dissolution than material 50. For instance, material 70 can be chosen to more rapidly oxidize under the utilized anodic dissolution conditions than does material 50.

Referring to FIG. 5, construction 10 is illustrated after the anodic dissolution process. Material 70 has been removed from physical and electrical contact with conductive material 50. Since conductive material 50 is in electrical connection with power source 74 (FIG. 4), and conductive material 70 is not in electrical connection with power source 74 except through the contact of material 70 with material 50, the anodic dissolution of material 70 stops once material 70 is no longer in electrical contact with conductive material 50.

Portions 80, 82, 84 and 86 of conductive material 70 remain within openings 54, 56, 58 and 60 after the anodic dissolution. The portions of conductive material 70 are spaced from one another, and also spaced from conductive material 50. Accordingly, the portions of conductor material 70 remaining in openings 54, 56, 58 and 60 can be referred to as spaced conductive regions. Ultimately, the spaced conductive regions can be incorporated into capacitor constructions, and accordingly the spaced conductive regions can be referred to as capacitor storage nodes 80, 82, 84 and 86, respectively.

Referring to FIG. 6, conductive material 50 (FIG. 5) is removed from over mass 14. Such can be accomplished by, for example, chemical-mechanical polishing to form a planarized upper surface 88 extending across insulative material 14. In addition to, or alternatively to, chemical-mechanical polishing, the conductive material 50 can be removed utilizing a wet etch or dry etch.

Referring to FIG. 7, a dielectric material 90 and a conductive material 92 are formed over storage nodes 80, 82, 84 and 86. Dielectric material 90 can comprise, for example, silicon dioxide, silicon nitride, tantalum pentoxide, etc. Conductive material 92 can comprise, for example, various metals and/or conductively-doped semiconductive materials (such as, for example, conductively-doped silicon). Storage nodes 80, 82, 84 and 86 can be referred to as isolated conductive masses, and accordingly, layers 90 and 92 can be described as being formed over the conductive masses 80, 82, 84 and 86. The conductive masses 80, 82, 84 and 86 are preferably capacitively separated from conductive material 92. Accordingly, capacitor constructions 94, 96, 98 and 100 are formed from the combination of masses 80, 82, 84 and 86, dielectric material 90, and conductive material 92. The capacitor constructions can be incorporated into DRAM devices, as shown.

Another aspect of the invention is described with reference to FIGS. 8 and 9. In referring to FIGS. 8 and 9, similar numbering will be used as was utilized above in describing FIGS. 1–7, where appropriate.

Figure 8:
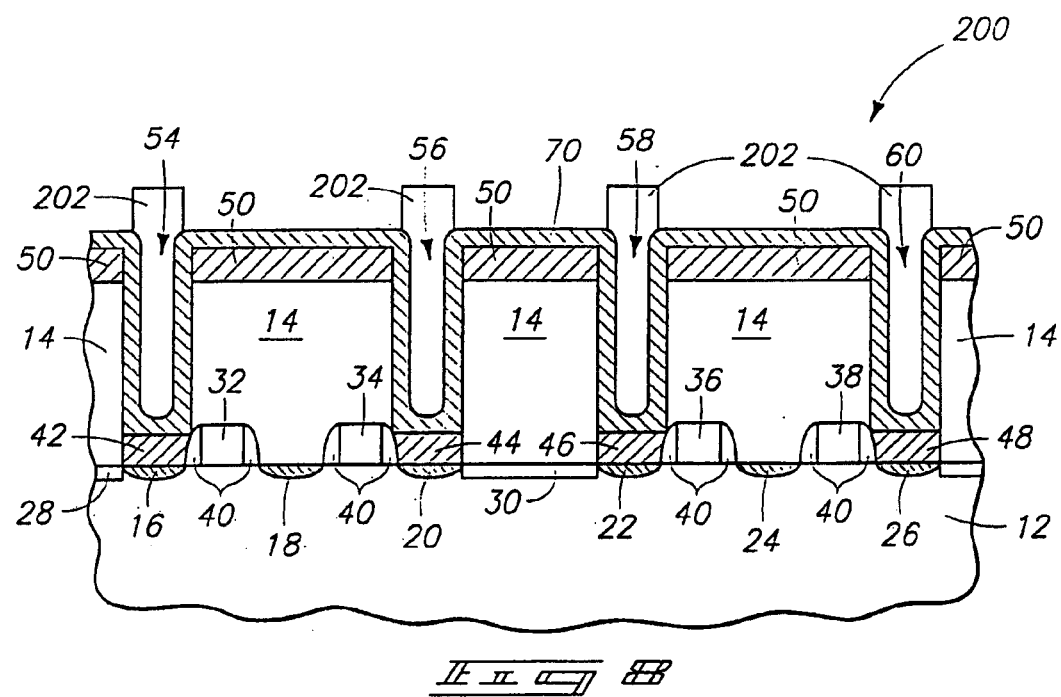
FIG. 8 is a view of the FIG. 1 fragment shown at a processing stage subsequent to that of FIG. 3, and in accordance with an alternative embodiment of the invention relative to that described with reference to FIG. 4.

FIG. 8 illustrates a construction 200 at a processing step subsequent to that of FIG. 3. Specifically, protective masses 202 are formed within openings 54, 56, 58 and 60. Masses 202 can comprise, for example, photoresist; and can be formed utilizing photolithographic processing and/or chemical-mechanical processing. The protective material 202 can comprise phosphosilicate glass (PSG) alternatively to, or in addition to, photoresist. The masses 202 protect portions of material 70 within openings 54, 56, 58 and 60 during anodic dissolution.

Figure 9:
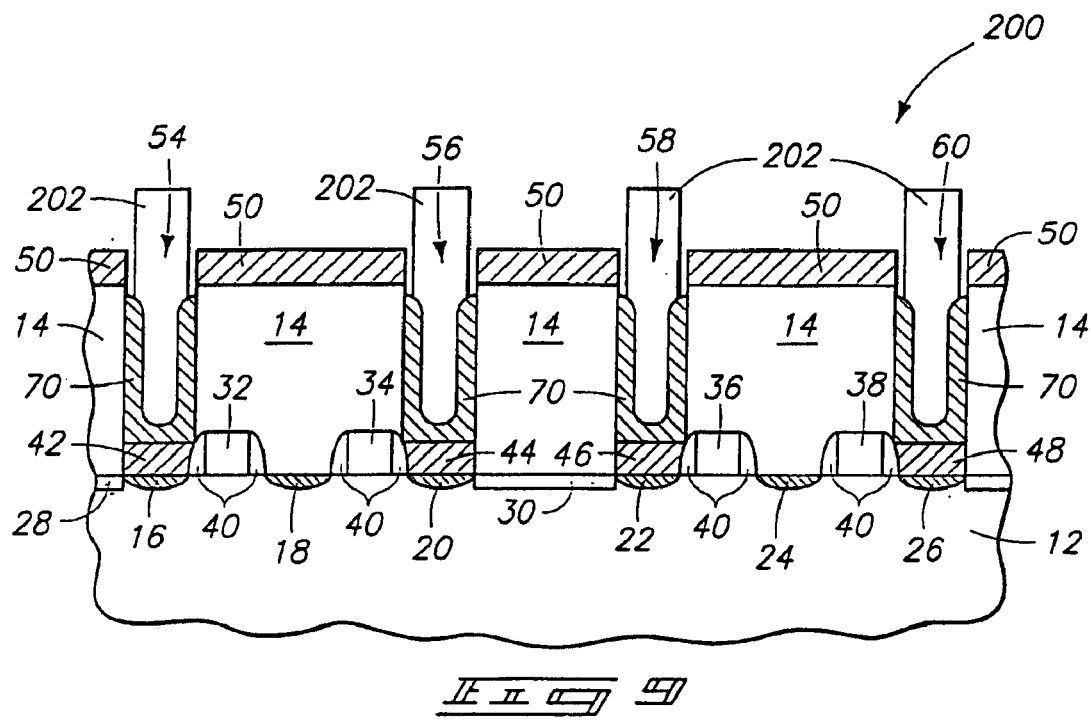
FIG. 9 is a view of the FIG. 1 fragment shown at a processing stage subsequent to that of FIG. 8.

Referring to FIG. 9, construction 200 is illustrated after anodic dissolution (the dissolution can be accomplished in accordance with the procedures described previously with reference to FIG. 4). The anodic dissolution has removed material 70 from over conductive material 50, similarly to the aspect described above with reference to FIG. 5. However, material 202 has protected the conductive material 70 within openings 54, 56, 58 and 60. The protection of material 70 can alleviate and/or prevent the conductive material 70 from being removed too rapidly from within the openings and either becoming undesirably thin, or having gaps extending through the portions of layer 70 remaining within the openings after the anodic dissolution.

Construction 200 of FIG. 9 can be subjected to processing similar to that described above with reference to FIGS. 6 and 7 to incorporate the material 70 remaining within the openings into capacitor constructions. It is noted that if chemical-mechanical polishing is utilized to remove material 50 (similar to the process described above with reference to FIG. 6), the protective masses 202 can remain within the openings during the chemical-mechanical polishing to avoid having particulates generated during the chemical-mechanical polishing falling onto the remaining portions of conductive material 70.

Protective masses 202 can be removed from within openings 54, 56, 58 and 60 prior to formation of capacitor constructions from the spaced portions of material 70. If the protective masses comprise photoresist, they can be removed by, for example, ashing or a suitable etch; and if the masses comprise PSG they can be removed with a suitable etch.

Another aspect of the invention is discussed with reference to FIGS. 10–14. In describing FIGS. 10–14, similar numbering will be used as was utilized above in describing FIGS. 1–7, where appropriate.

Figure 10:
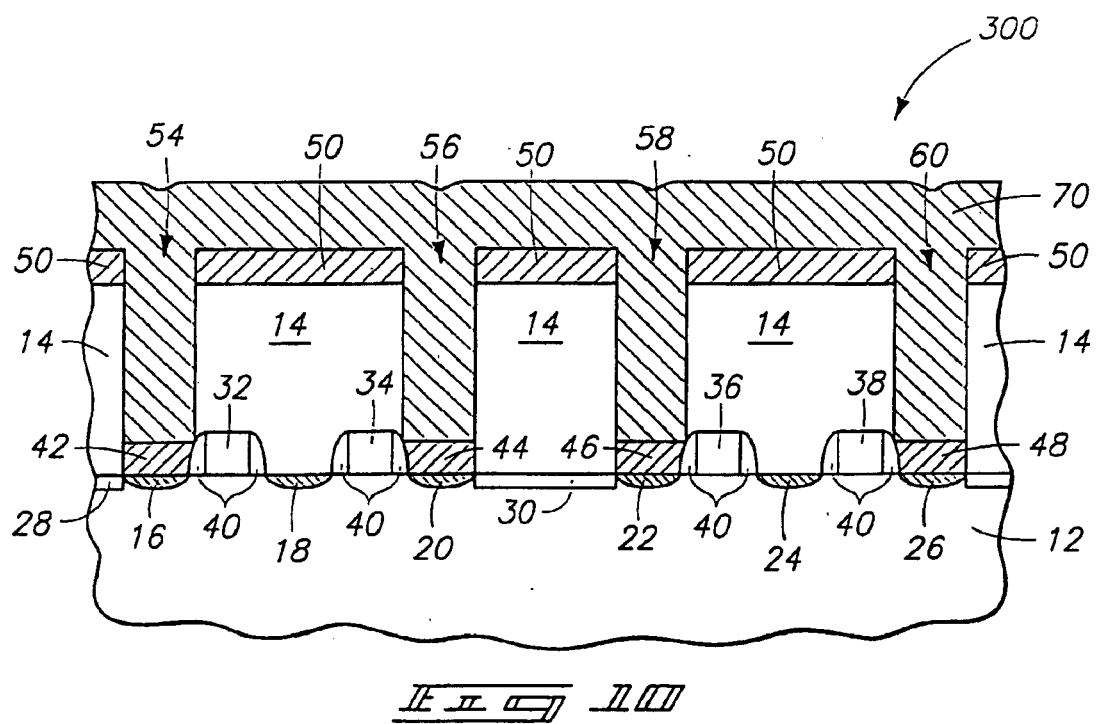
FIG. 10 is a view of the FIG. 1 fragment shown at a processing stage subsequent to that of FIG. 2, and in accordance with yet another embodiment of the invention.

Referring initially to FIG. 10, a construction 300 is illustrated at a processing step subsequent to that of FIG. 2. The construction 300 is similar to the construction 10 of FIG. 3, in that second conductive material 70 has been formed over first conductive material 50, and within openings 54, 56, 58 and 60. However, construction 300 differs from the construction 10 of FIG. 3 in that second conductive material 70 entirely fills the openings 54, 56, 58 and 60.

Figure 11:
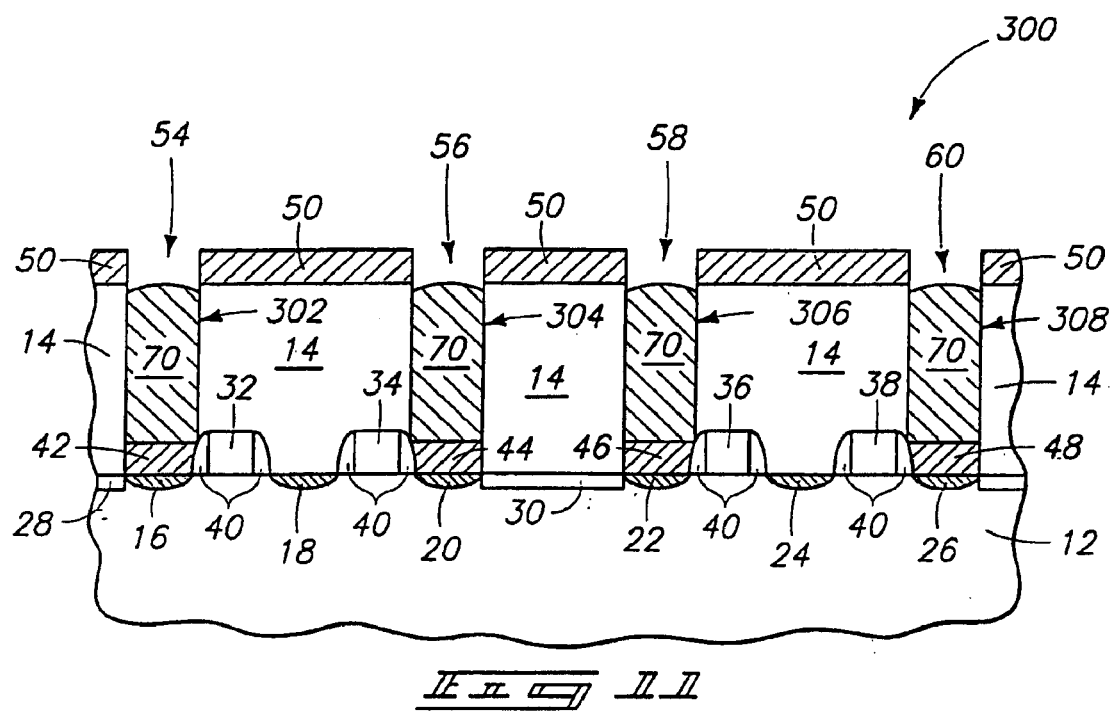
FIG. 11 is a view of the FIG. 1 fragment shown at a processing stage subsequent to that of FIG. 10.

Referring to FIG. 11, construction 300 is illustrated after anodic dissolution of some of material 70. The dissolution can be accomplished utilizing procedures described above with reference to FIG. 4. The conductive material 70 remaining after the anodic dissolution forms spaced conductive masses 302, 304, 306 and 308 within openings 54, 56, 58 and 60, respectively.

Figure 12:
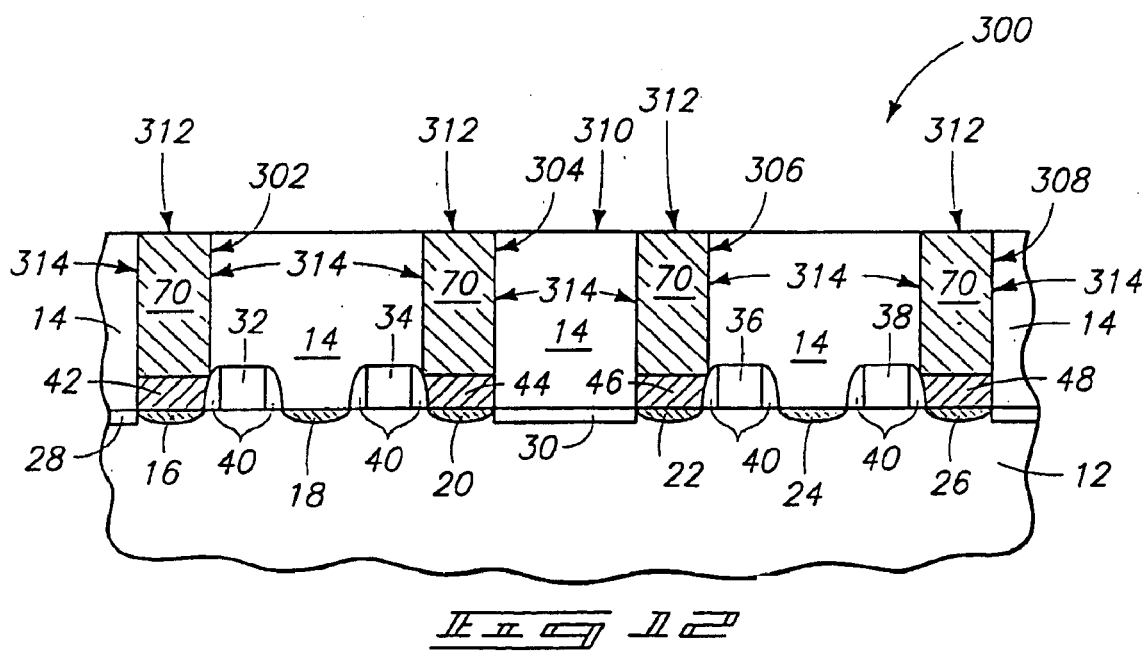
FIG. 12 is a view of the FIG. 1 fragment shown at a processing stage subsequent to that of FIG. 11.

Referring to FIG. 12, first conductive material 50 (FIG. 11) is removed. The first conductive material can be removed utilizing, for example, chemical-mechanical polishing to form a planar surface 310 extending across insulative mass 14, and across upper surfaces of conductive masses 302, 304, 306 and 308. It is noted that although the polishing is shown planarizing an upper surface of masses 302, 304, 306 and 308, the invention encompasses other applications (not shown) in which the upper surfaces of the masses 302, 304, 306 and 308 are not polished. Applications in which upper surfaces of the masses 302, 304, 306 and 308 are not polished can be preferred if the masses comprise materials, such as platinum, that can undesirably smear during a polishing process.

The conductive masses 302, 304, 306 and 308 of FIG. 12 can be considered to comprise top surfaces 312, and sidewall surfaces 314 extending downwardly from the top surfaces.

Figure 13:
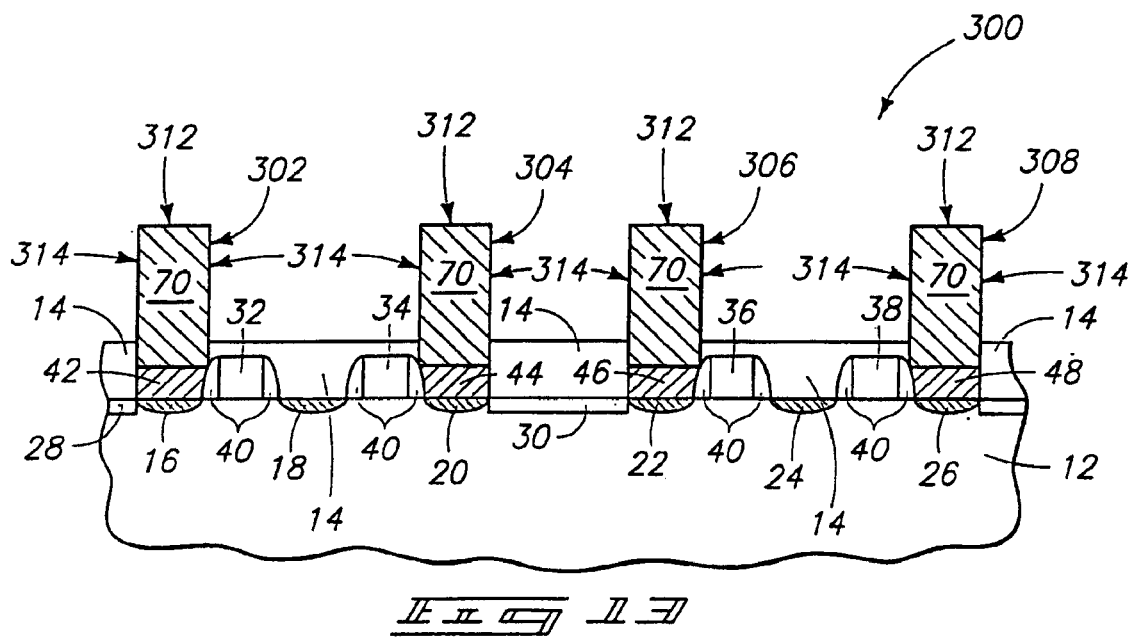
FIG. 13 is a view of the FIG. 1 fragment shown at a processing stage subsequent to that of FIG. 12.

Referring to FIG. 13, at least some of the insulative mass 14 is removed from between conductive masses 302, 304, 306 and 308 to expose the sidewall surfaces 314.

Figure 14:
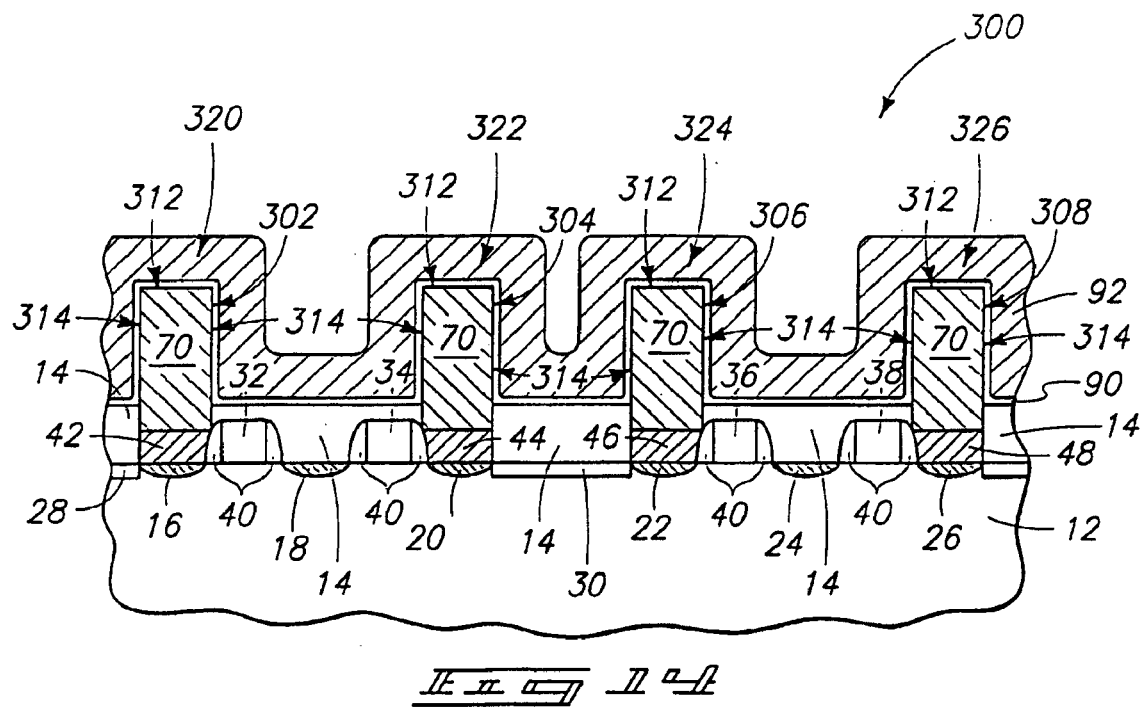
FIG. 14 is a view of the FIG. 1 fragment shown at a processing stage subsequent to that of FIG. 13.

Referring to FIG. 14, dielectric material 90 and conductive material 92 are formed over conductive masses 302, 304, 306 and 308. More specifically, the dielectric material 90 and conductive-material 92 are formed over top surfaces 312 of the conductive masses, as well as along the sidewall surfaces 314 of the conductive masses. The masses 302, 304, 306 and 308, together with dielectric material 90 and conductive material 92, define capacitor constructions 320, 322, 324 and 326.

Although only some of the sidewall surfaces 314 are exposed in the processing of FIG. 13, it is to be understood that the invention encompasses other embodiments (not shown) wherein a sufficient amount of material 14 is removed to expose an entirety of the sidewall surfaces 314 of masses 302, 304, 306 and 308.

Another aspect of the invention is described with reference to FIGS. 15 and 16. In describing FIGS. 15 and 16, similar numbering will be used as was utilized above in describing FIGS. 1–7, where appropriate.

Figure 15:
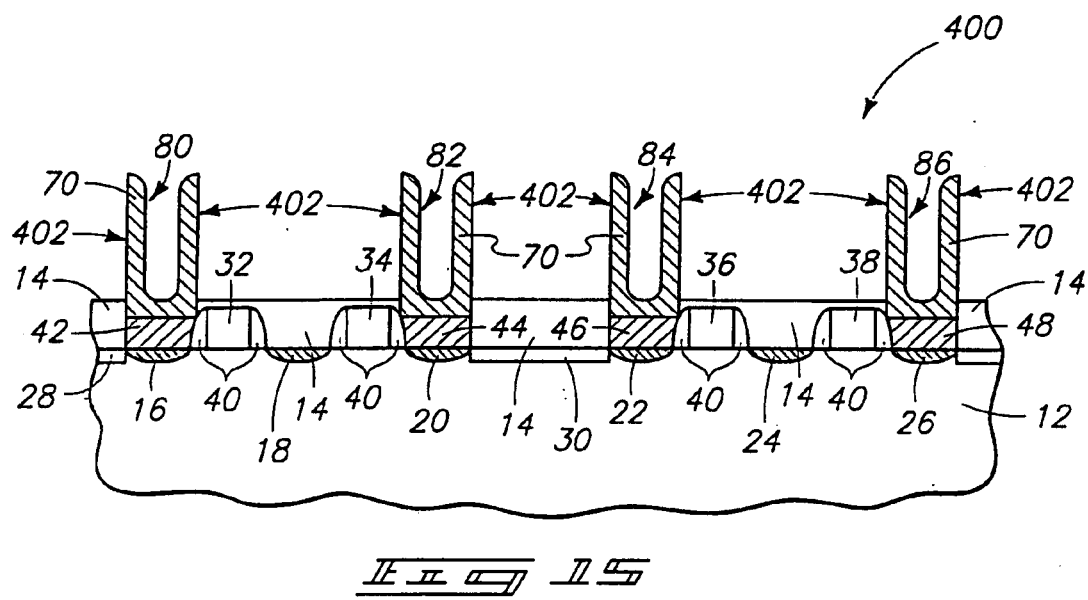
FIG. 15 is a view of the FIG. 1 fragment shown at a processing stage subsequent to that of FIG. 6, in accordance with an alternative aspect of the invention relative to that shown in FIG. 7.

Referring initially to FIG. 15, a construction 400 is illustrated at a processing step subsequent to that of FIG. 6. Construction 400 comprises the spaced conductive masses 80, 82, 84 and 86 which were described previously with reference to FIG. 6. The thickness of insulative material 14 has been reduced relative to that of FIG. 6, to expose sidewall surfaces 402 of the conductive masses 80, 82, 84 and 86.

Figure 16:
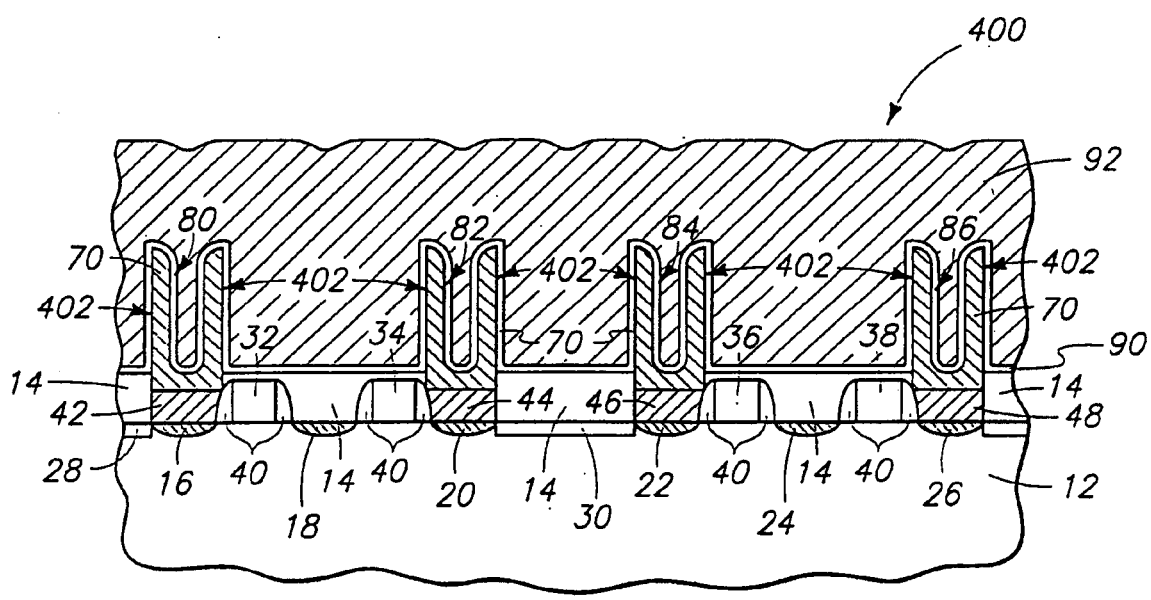
FIG. 16 is a view of the FIG. 1 fragment shown at a processing stage subsequent to that of FIG. 15.

Referring to FIG. 16, dielectric material 90 and conductive material 92 are formed over the conductive masses 80, 82, 84 and 86. The dielectric material 90 and conductive material 92 also extend along sidewall surfaces 402 of the conductive masses.

Although the thickness of material 14 is reduced sufficiently to only expose portions of sidewall surfaces 402 of conductive masses 80, 82, 84 and 86, it is to be understood that the invention encompasses other embodiments (not shown) wherein the thickness of insulative mass 14 is sufficiently reduced to expose an entire expanse of sidewall surfaces 402.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming spaced conductive regions associated with a semiconductor construction, comprising:
   providing a construction which includes:
      a power source;
      a first electrically conductive material over a semiconductor substrate, and electrically connected with the power source; and
      a second electrically conductive material electrically connected with the power source only through the first electrically conductive material, the second electrically conductive material being different from the first electrically conductive material; and
   utilizing the power source to remove some of the second electrically conductive material; portions of the second electrically conductive material becoming electrically isolated from the first electrically conductive material by the removal of some of the second electrically conductive material; said portions remaining as the spaced conductive regions after the power source is utilized to remove some of the second electrically conductive material.

2. The method of claim 1 wherein the second electrically conductive material is oxidized during the utilizing of the power source to remove some of the second electrically conductive material; and wherein the oxidation of the second electrically conductive material is more rapid than any oxidation of the first electrically conductive material during said utilizing of the power source.

3. The method of claim 1 wherein the first electrically conductive material comprises tungsten and the second electrically conductive material comprises one or more of platinum, rhodium, iridium, ruthenium.

4. The method of claim 1 wherein the first electrically conductive material comprises tungsten and the second electrically conductive material comprises platinum.

5. The method of claim 1 wherein the first electrically conductive material consists essentially of tungsten and the second electrically conductive material consists essentially of platinum.

6. The method of claim 1 wherein the substrate comprises monocrystalline silicon.

7. A method of forming capacitor constructions, comprising:
   providing a substrate;
   providing a first electrically conductive material over the substrate;

providing openings extending through the first electrically conductive material and into the substrate;

forming a second electrically conductive material within the openings and over the first electrically conductive material, the second electrically conductive material being different from the first electrically conductive material and being in electrical contact with the first electrically conductive material;

electrically removing some of the second electrically conductive material; the first electrically conductive material being electrically connected to a power source during the removal of some of the second electrically conductive material and the second electrically conductive material being electrically connected to the power source only through the first electrically conductive material; the second electrically conductive material within the openings becoming electrically isolated from the first electrically conductive material during the removal of some of the second electrically conductive material and remaining within the openings as spaced conductive masses after the removal of some of the second electrically conductive material;

forming dielectric material over the spaced conductive masses; and forming capacitor electrode material over the dielectric material and capacitively separated from the conductive masses.

8. The method of claim 7 wherein the first electrically conductive material comprises tungsten and the second electrically conductive material comprises one or more of platinum, rhodium, iridium, ruthenium.

9. The method of claim 7 wherein at least some of the first electrically conductive material remains over the substrate after the removal of some of the second electrically conductive material; and wherein chemical-mechanical polishing is utilized to remove the remaining first electrically conductive material from over the substrate.

10. A method of forming capacitor constructions, comprising:

providing a substrate comprising monocrystalline silicon and an insulative material over the monocrystalline silicon;

forming a first electrically conductive material over the substrate;

forming openings extending through the first electrically conductive material and into the insulative material;

forming a second electrically conductive material within the openings, the second electrically conductive material being different from the first electrically conductive material, the second electrically conductive material only partially filling the openings, the second electrically conductive material being in electrical contact with the first electrically conductive material;

electrically removing some of the second electrically conductive material; the first electrically conductive material being electrically connected to a power source during removal of some of the second electrically conductive material and the second electrically conductive material being electrically connected to the power source only through the first electrically conductive material; the second electrically conductive material within the openings becoming electrically isolated from the first electrically conductive material during the removal of some of the second electrically conductive material and remaining within the openings as spaced conductive masses;

removing at least some of the first conductive material from over the substrate after removing some of the second electrically conductive material;

forming dielectric material within the partially filled openings and over the spaced conductive masses; and forming capacitor electrode material over the dielectric material and capacitively separated from the conductive masses.

11. The method of claim 10 wherein the first electrically conductive material comprises tungsten and the second electrically conductive material comprises one or more of platinum, rhodium, iridium, ruthenium.

12. The method of claim 10 wherein chemical-mechanical polishing is utilized to remove the first conductive material from over the substrate.

13. The method of claim 10 further comprising:

forming a protective material within the partially filled openings; the protective material remaining within the openings during the removal of some of the second electrically conductive material; and removing the protective material from within the openings prior to forming the dielectric material.

14. The method of claim 13 wherein the protective material comprises photoresist.

15. The method of claim 13 wherein the protective material comprises PSG.

16. The method of claim 10 wherein the conductive masses have sidewall surfaces along the masses, and further comprising:

removing at least some of the substrate to expose at least portions of the sidewall surfaces of the conductive masses; and forming the dielectric material along the exposed portions of the sidewall surfaces.

17. A method of forming capacitor constructions, comprising:

providing a substrate;

forming a first electrically conductive material over the substrate;

forming a second electrically conductive material in electrical connection with the first electrically conductive material, the second electrically conductive material being different from the first electrically conductive material;

electrically connecting the second electrically conductive material to a power source through the first electrically conductive material and electrically removing some of the second electrically conductive material; portions of the second electrically conductive material becoming electrically isolated from the first electrically conductive material during the removal of some of the second electrically conductive material and remaining as spaced conductive masses associated with the substrate;

forming dielectric material over the spaced conductive masses; and forming capacitor electrode material over the dielectric material and capacitively separated from the spaced conductive masses.

18. The method of claim 17 wherein the first electrically conductive material comprises tungsten and the second electrically conductive material comprises one or more of platinum, rhodium, iridium, ruthenium.

19. The method of claim 17 wherein the substrate comprises an electrically insulative material over a monocrystalline silicon base; the method further comprising forming openings extending into the electrically insulative material; and wherein the forming the second electrically conductive material comprises forming the second electrically conductive material to extend within the openings in the electrically insulative material.

* * * * *